(12) United States Patent
Segawa et al.

(10) Patent No.: US 12,372,953 B2
(45) Date of Patent: Jul. 29, 2025

(54) DYNAMIC SAMPLING METHOD AND DEVICE FOR SEMICONDUCTOR MANUFACTURE

(71) Applicant: Winbond Electronics Corp., Taichung (TW)

(72) Inventors: Kazuhiro Segawa, Taichung (TW); Chiang-Sheng Liu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 528 days.

(21) Appl. No.: 17/878,938

(22) Filed: Aug. 2, 2022

(65) Prior Publication Data

US 2024/0045408 A1 Feb. 8, 2024

(51) Int. Cl.
*G05B 19/418* (2006.01)
*H01J 37/28* (2006.01)
*H01L 21/66* (2006.01)

(52) U.S. Cl.
CPC . *G05B 19/41885* (2013.01); *G05B 19/41875* (2013.01); *H01J 37/28* (2013.01); *H01L 22/12* (2013.01); *G05B 2219/37127* (2013.01); *G05B 2219/37224* (2013.01); *G05B 2219/45031* (2013.01); *H01J 2237/2817* (2013.01); *H01L 22/20* (2013.01)

(58) Field of Classification Search
USPC .......................................... 702/155
See application file for complete search history.

(56) References Cited

U.S. PATENT DOCUMENTS

| | | | |
|---|---|---|---|
| 6,442,496 B1 | 8/2002 | Pasadyn et al. | |
| 9,404,743 B2 | 8/2016 | Chiu et al. | |
| 2005/0154484 A1* | 7/2005 | Lee | G03F 7/70633 700/121 |
| 2010/0312374 A1* | 12/2010 | Tsai | H01L 22/12 700/121 |
| 2014/0282324 A1* | 9/2014 | Greiner | G06F 30/39 716/111 |
| 2016/0274570 A1 | 9/2016 | Shih et al. | |
| 2019/0187555 A1 | 6/2019 | Lin et al. | |
| 2023/0076185 A1* | 3/2023 | Larranaga | G05B 19/41875 |

FOREIGN PATENT DOCUMENTS

TW 201203416 1/2012

OTHER PUBLICATIONS

"Office Action of Taiwan Counterpart Application", issued on Apr. 9, 2024, p. 1-p. 5.

* cited by examiner

*Primary Examiner* — Paul D Lee
(74) *Attorney, Agent, or Firm* — JCIPRNET

(57) ABSTRACT

A dynamic sampling method and device for semiconductor manufacture are provided. The dynamic sampling method includes: generating an N-dimensional virtual image of a wafer based on a design rule and at least one of a quality control data and context data; measuring a critical pattern in the N-dimensional virtual image to generate a virtual metrology result by using a virtual metrology; determining whether the virtual metrology result is larger than a threshold; not performing a measurement on the wafer in a case that the virtual metrology result is larger than the threshold; and performing the measurement on the wafer in a case that the virtual metrology result is not larger than the threshold.

18 Claims, 9 Drawing Sheets

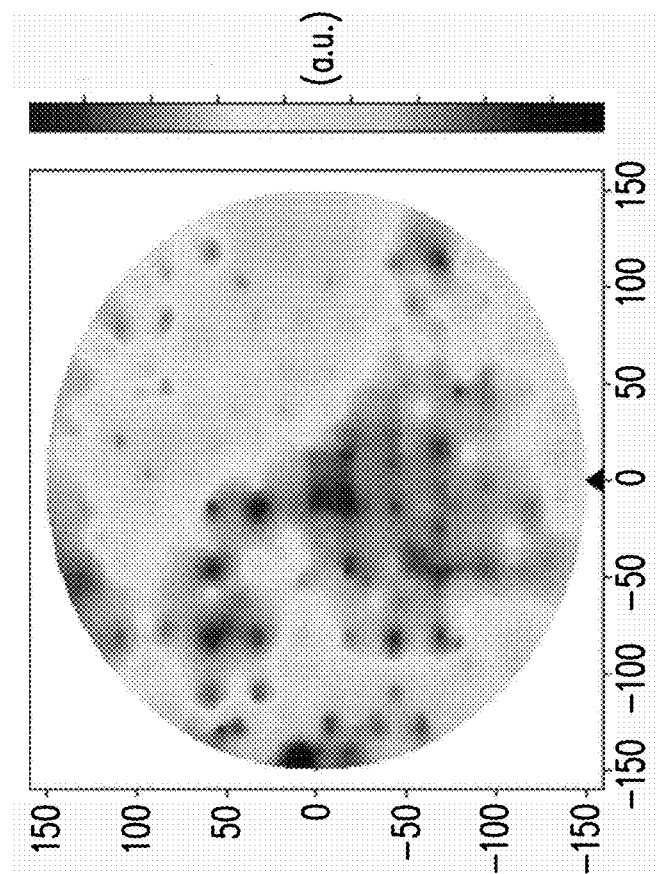
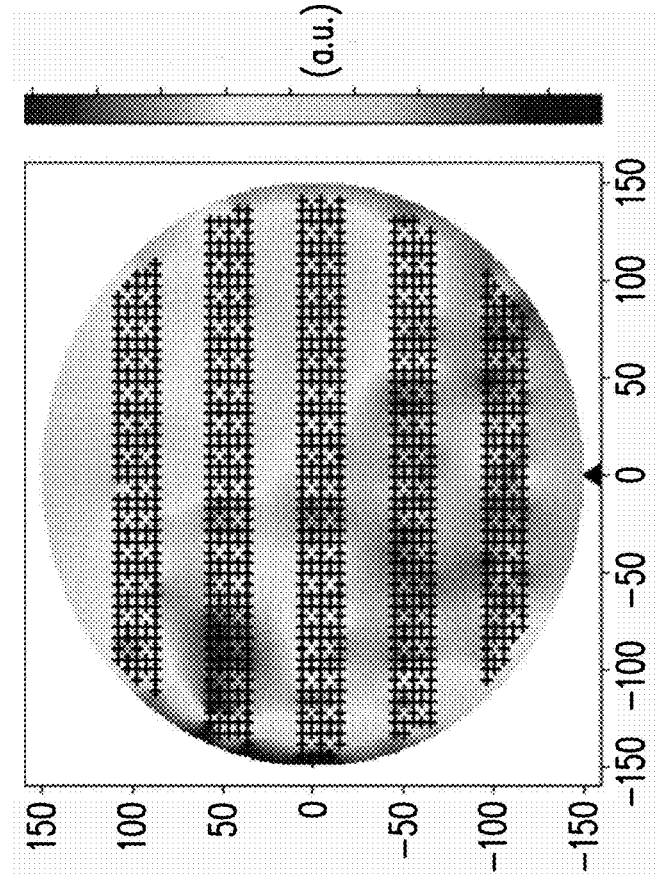
FIG. 4A
FIG. 4B

DYNAMIC SAMPLING METHOD AND DEVICE FOR SEMICONDUCTOR MANUFACTURE

BACKGROUND

Technical Field

The invention relates to a dynamic sampling method and device for semiconductor manufacture.

Description of Related Art

Any Scanning Electron Microscope (SEM)-type inspection and metrology tool spend long time for measuring wafers. For example, in a certain process, especially, which high-voltage SEM measurement is required, it may spend about 100 minutes to complete the measurement of wafers in case of 1000 scan sites by move-acquire-measure (MAM) time is around 6 seconds per site. In generally, the static sampling method (measurement periodically for lot and wafer, fix locations in wafer) is adopted, but such method may be inefficient.

Currently, a high voltage SEM is used for checking a critical pattern. Taking capacitor contact (CC) and node contact (NC) as example, the measurement for the bottom contact area may spend about 100 minutes per wafer. Therefore, the measurement for checking the wafer spend too much time.

There are needs to further reduce the measurement time for checking the wafer to increase the manufacture performance.

SUMMARY

In view of above description, according to one embodiment of the invention, a dynamic sampling method for semiconductor manufacture performed by a processor is provided. The dynamic sampling method comprises: generating an N-dimensional virtual image of a wafer based on a design rule and at least one of a quality control data and context data; measuring a critical pattern in the N-dimensional virtual image to generate a virtual metrology result by using a virtual metrology; determining whether the virtual metrology result is larger than a threshold; not performing a measurement on the wafer in a case that the virtual metrology result is larger than the threshold; and performing the measurement on the wafer in a case that the virtual metrology result is not larger than the threshold.

In one embodiment, in the dynamic sampling method, the method further comprises: collecting the design rule and at least one of the quality control data and context data from a semiconductor device.

In one embodiment, in the dynamic sampling method, the method further comprises: set a model for generating the N-dimensional virtual image based on the design rule and at least one of the quality control data and context data. In one embodiment, in the dynamic sampling method, the model is set using a machine learning or a deep learning.

In one embodiment, in the dynamic sampling method, the method further comprises: in the case that the virtual metrology result is not larger than the threshold, determining sampling positions based on the virtual metrology result, and performing the measurement to the sampling positions of the wafer.

In one embodiment, in the dynamic sampling method, the quality control data may comprise at least one of in line quality control (IQC) data and machine quality control (MQC) data. In one embodiment, the IQC data may include items of critical dimension data and overlay data. In one embodiment, the design rule may comprise at least an alignment tree. In one embodiment, the threshold may be a statistic value including at least one of a mean value or a standard deviation. In one embodiment, the critical pattern may comprise at least one of a shape, a critical dimension, an area and a distance among patterns for a measurement target by using a virtual metrology.

According to another embodiment of the invention, a dynamic sampling device for semiconductor manufacture is provided. The dynamic sampling device comprises a processor; and a storage unit. The processor is configure to generate an N-dimensional virtual image of a wafer based on a design rule and at least one of a quality control data and context data; measure a critical pattern in the N-dimensional virtual image to generate a virtual metrology result by using a virtual metrology; determine whether the virtual metrology result is larger than a threshold; not perform a measurement on the wafer in a case that the virtual metrology result is larger than the threshold; and perform the measurement on the wafer in a case that the virtual metrology result is not larger than the threshold.

In one embodiment, in the dynamic sampling device, the processor is further configured to collect the design rule and at least one of the quality control data and context data from a semiconductor device that perform a manufacturing process on the wafer, and store the design rule and at least one of the quality control data and context data in the storage unit.

In one embodiment, in the dynamic sampling device, the processor is further configured to set a model for generating the N-dimensional virtual image based on the design rule and at least one of the quality control data and context data. In one embodiment, in the dynamic sampling device, the model is set using a machine learning or a deep learning.

In one embodiment, in the dynamic sampling device, in the case that the virtual metrology result is not larger than the threshold, the processor is configured to determine sampling positions based on the virtual metrology result, and perform the measurement to the sampling positions of the wafer.

In one embodiment, in the dynamic sampling method, the quality control data may comprise at least one of in line quality control (IQC) data and machine quality control (MQC) data. In one embodiment, the IQC data may include items of critical dimension data and overlay data. In one embodiment, the design rule may comprise at least an alignment tree. In one embodiment, the threshold may be a statistic value including at least one of a mean value or a standard deviation. In one embodiment, the critical pattern may comprise at least one of a shape, a critical dimension, an area and a distance among patterns for a measurement target by using a virtual metrology.

According to the above embodiment, the N-dimensional virtual image is first used to perform the dynamic sampling method, and thus it is not necessary to perform all scan sites on the wafer. The scan sites and the measurement time can be thus effectively reduced. In the current method, all the scan sites on the wafer have to be measured to determine whether the wafer can pass the QC check or not. However, the dynamic sampling method of the embodiment can provide effect prediction so that the scan sites that really have to be measured can be effectively predicted and determined. Therefore, the actual scan sites that really have to be measured can be effectively reduced and the corresponding measurement time can be also reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4A and FIG. 4B illustrate measurement contour maps between the actual measurement and the virtual metrology.

DESCRIPTION OF THE EMBODIMENTS

Figure 1A:
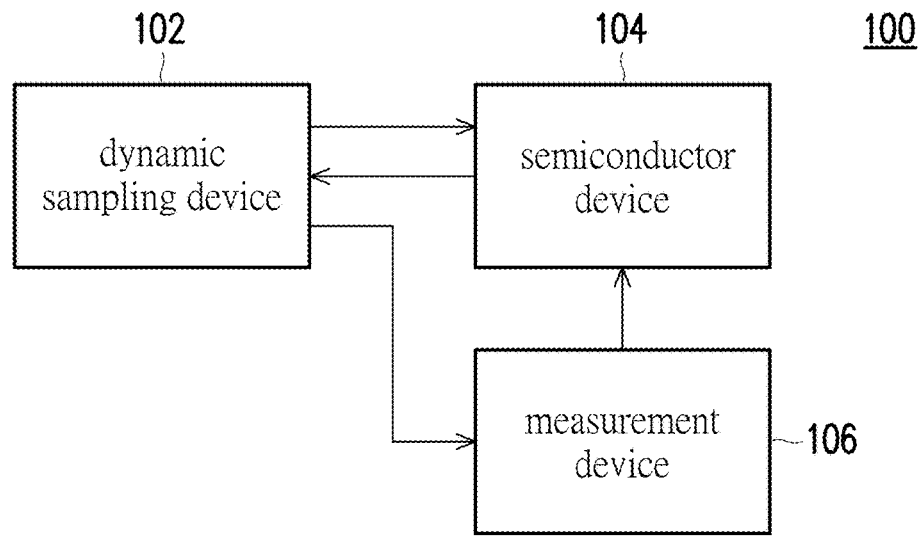
FIG. 1A illustrates a schematic diagram for a configuration of a dynamic sampling system according to one embodiment of the invention.

FIG. 1A illustrates a schematic diagram for a configuration of a dynamic sampling system according to one embodiment of the invention.

Figure 1B:
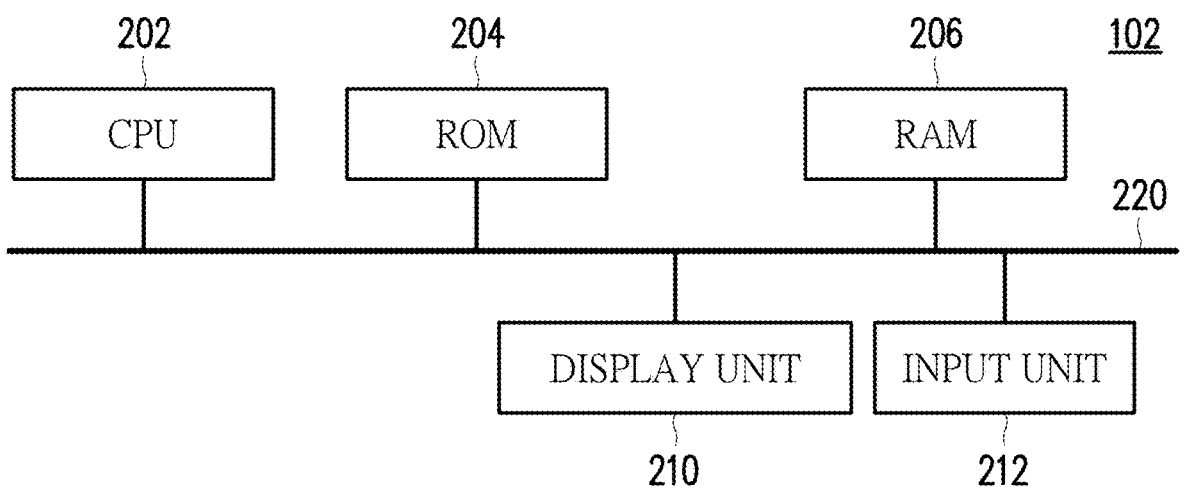
FIG. 1B illustrates a schematic diagram for a configuration of a dynamic sampling device according to one embodiment of the invention.

As shown in FIG. 1B, the dynamic sampling system 100 comprises a dynamic sampling device 102, at least one semiconductor device 104 and a measurement device 106 corresponding to the semiconductor device 104. The semiconductor device 104 is used for manufacturing the semiconductor products, and although one semiconductor device 104 is depicted for simplicity, but actually there are plural machines arranged in the production line. As an example, the semiconductor device 104 can be a device for performing the etching process, deposition process, photolithography process, etc. The measurement device 106 can perform a measurement to carry out a quality check, etc. One measurement device 106 can be provided for the plural semiconductor devices 104, or each semiconductor device 104 can be provided with one semiconductor devices 104, which is not limited to the implementation of the embodiment of the invention.

The dynamic sampling device 102 is a core device according to the embodiment of the invention. The dynamic sampling device 102 may send a request to the semiconductor device 104 for requesting and then collecting at least one design rule of the semiconductor device 104. After collecting the design rule, the dynamic sampling device 102 may analyze the collected data to determine whether a measurement is requirement to the semiconductor device 104 based on an analysis result. When the measurement is required, the dynamic sampling device 102 then generates a control signal to make the measurement device 106 to perform the measurement to the wafer in the semiconductor device 104 after the process is finished. The communication between the dynamic sampling device 102 and the semiconductor device 104 and the measurement device 106 can be performed through an internal network by using any suitable protocols, and the communication can be performed by a wired or a wireless manner.

FIG. 1B illustrates a schematic diagram for a configuration of a dynamic sampling device according to one embodiment of the invention. In general, the dynamic sampling device 102 may be implemented by a computer or a terminal device such as tablet, which is not particularly limited while implementing the embodiment. As shown in FIG. 1B, the dynamic sampling device 102 may comprise a processor (or a CPU) 202, a storage unit such as a ROM 204 and a RAM 206, a display unit 210 and an input unit 212 such as a keyboard, mouse. All these components are coupled through a bus (or system bus) 220.

The CPU 202 is a core component of the dynamic sampling device 102 and controls all components of the dynamic sampling device 102. The CPU 202 is also configured to acquire design rule from the semiconductor device 104, perform data analysis and perform the algorithm to implement the dynamic sampling. The ROM 204 is used to store in-line measurement data made by the measurement device 106 and also store GDS files. The display unit 210 can display the dynamic sampling result, analysis result or setting configuration on the tool (semiconductor device 104). The user can input command, data or configuration settings through the input unit 212. The details of dynamic sampling process will be further described with reference to FIG. 2.

Figure 2:
FIG. 2 illustrates a flow chart of a dynamic sampling method according to one embodiment of the invention.

FIG. 2 illustrates a flow chart of a dynamic sampling method according to one embodiment of the invention. As shown in FIG. 2, in step S100, first a design rule is collected from the semiconductor device 104 by the dynamic sampling device 102. The design rule may include alignment tree, for example. Other design rules may be word line pitch, bit line pitch, active area angle, etc. For those skilled in this art, the design rule for semiconductor manufacture is well known and suitable design rules can be selected for performing the dynamic sampling method.

In step S102, the IQC (in line quality control), MQC (machine quality control) and context data, etc. are also collected from the semiconductor device 104 by the dynamic sampling device 102. The IQC and MQC data may have any measurement result. The IQC data may include items of CD (critical dimensions) and OVL (overlay among layers). As examples. The critical dimensions may include bit line width, depth of word line trench, word line length, etc., and the overlay may include overlay between word line and node contact, overlay between word line and active area, etc.

In addition, the optical microscope (OM) image and scanning electron microscope (SEM) image may be used to acquire the IQC and MQC data. The context data may have shot map information, equipment identification (eqp_id), chamber identification (chamber_id) and so on.

In step S104, a model for generating a N-dimensional virtual image is set. The model may use machine learning, deep learning and so on. Various model can be used for simulates the actual semiconductor product, and as long as the model can be adopted to perform the dynamic sampling of the embodiment, the model used for the dynamic sampling is not particularly limited.

In step S106, the N-dimensional virtual image is then generated by the model. The N-dimensional virtual image may be generated by using CAD data such as gds files, oas files, and, etc. The N-dimensional virtual image is generated according to the measurement requirement. For example, when the area of the active area is to be measured, a two-dimensional virtual image can be used. In this case, the dynamic sampling device 102 generates the two-dimensional virtual image by using the model established and set in step S104 based on the design rules, IQC, MQC, and/or context data. In another exemplary case, when trenches, holes or pillar etc. formed in the wafer are targets to be measured, a three-dimensional virtual image can be used for measuring the depth of trench or the length of hole, etc.

In step S108, a critical pattern (measurement target) of the N-dimensional virtual image is measured by using a virtual metrology to generate a virtual metrology result. According to the embodiment of the invention, the measurement is not performed on the actual wafer, but on the generated N-dimensional virtual image using virtual metrology. Therefore, no actual measure is required according to the embodiment of the invention. The measurement on the N-dimensional virtual image may be carried out by a processing algorithm performed by the dynamic sampling device 102. As the critical pattern (measurement target) to be measured, shape, critical dimension, area, distance among patterns, etc. may be used.

Figure 3:
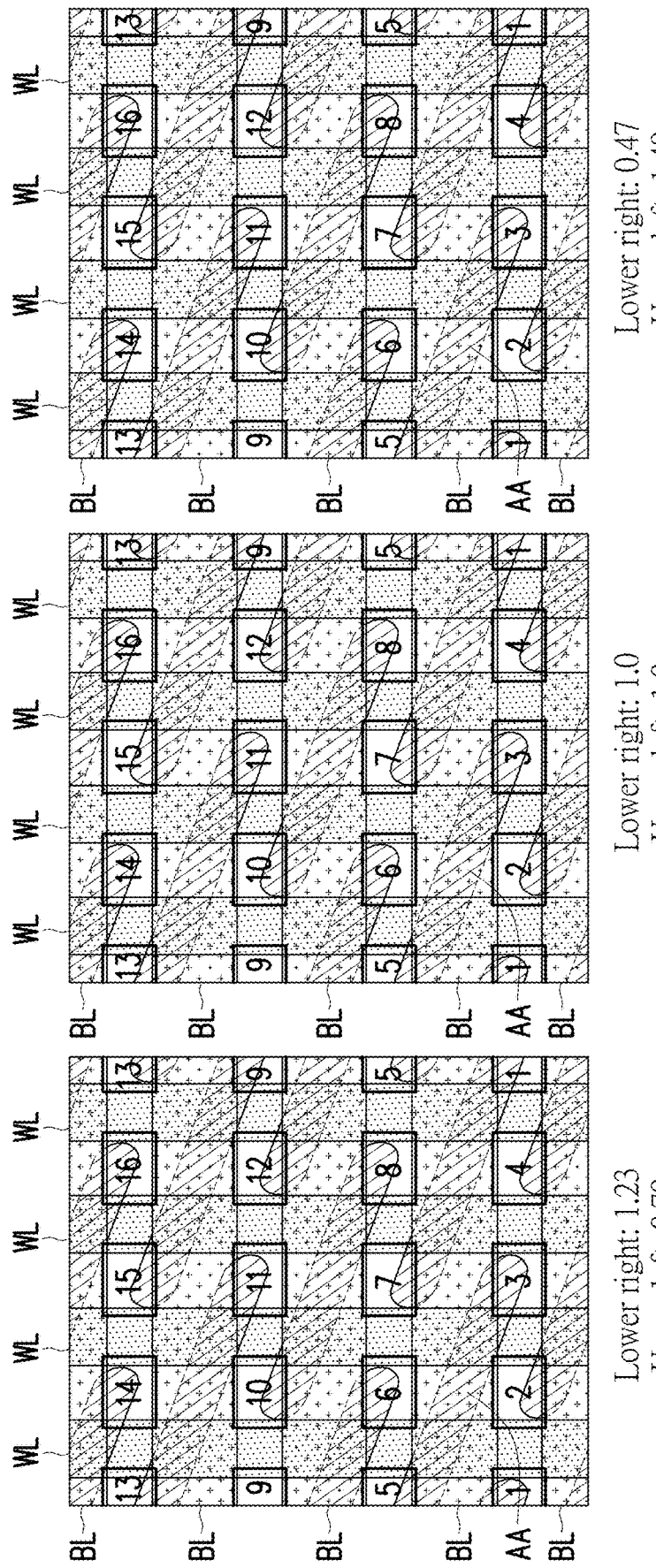
FIG. 3 illustrates an example of the N-dimensional virtual image.

FIG. 3 illustrates an example of the 2-dimensional virtual image. In FIG. 3, it illustrates the 2-dimensional virtual images that indicate active area, bit line and world line on the wafer. As shown in FIG. 3, plural contacts 1-16 are depicted, and the inclined and dashed regions connected by two contacts are active regions AA, such as the active regions AA between the contacts 1-16. In FIG. 3, the word lines WL and bit lines BL perpendicular to bit lines BL are also depicted.

In this example, the area of the contacts 1-16 can be measured based on the 2-dimensional virtual image by the virtual metrology. In FIG. 3, for example, the measured areas are a ratio 1.23 for the lower right contact (refer to 8) and 0.79 for the upper left contact (refer to in left 2-dimensional virtual image of FIG. 3, compared with measured areas of ideal case. As shown, FIG. 3 also illustrates a result that when the bit lines BL are shifted with respect to the active area AA, the area of the contact becomes smaller. The contact area may be influenced by input measurement result (such as IQC variations).

FIG. 4A and FIG. 4B illustrate measurement contour maps between the actual measurement and the virtual metrology. As shown in FIG. 4A, according to the existent method, after a certain process (such as forming the node contact) is performed, the areas of the contacts on the wafer are actually measured. In this example, there are 968 scan sites on the wafer to be measured and it spends about 100 minutes to complete the measurement. However, as shown in FIG. 4B, by using the embodiment of the invention, the measurement is carried out by the dynamic sampling device 102 without using the measurement device and thus the measurement time is 0. At this stage of the embodiment, only the processing time (execution time of algorithm or program) is required and it is not necessary to spend time to actually perform the measurement.

In addition, referring to the measurement contour maps between the actual measurement and the virtual metrology, even though there are few inconsistent portions between the two measurement contour maps, but the two measurement contour maps are almost the same. Therefore, the trend in the wafer based on the measurement contour map using the virtual metrology based on the embodiment of the invention can be well predicted with a probability over at least 50%.

Figure 5A:
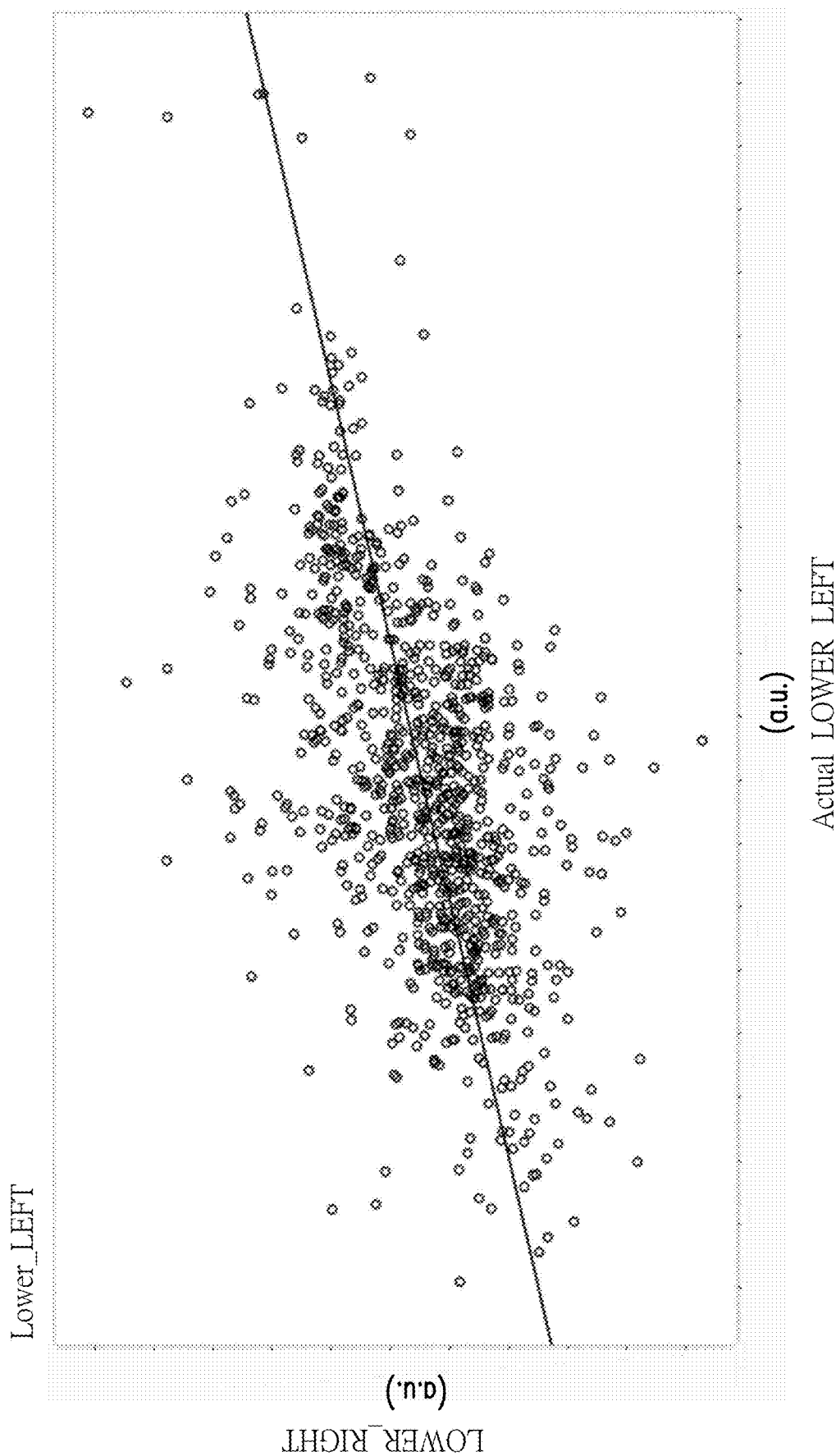
FIG. 5A and FIG. 5B illustrate the correlation between the actual measurement and the virtual metrology.
Figure 5B:
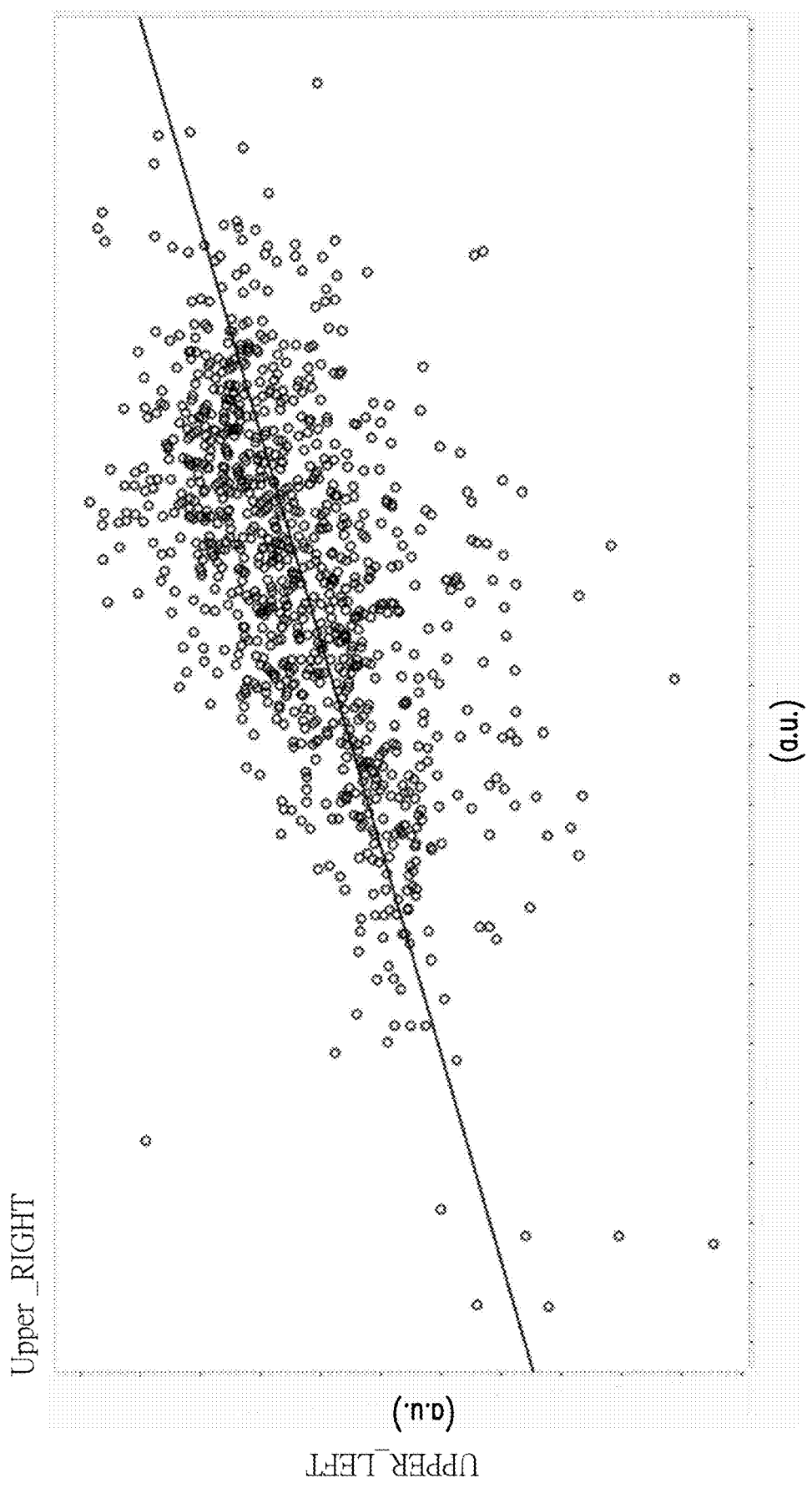

FIG. 5A and FIG. 5B illustrate the correlation between the actual measurement and the virtual metrology. In FIG. 5A and FIG. 5B, the correlations of the contact area between the actual measurement (X-axis) and the virtual metrology (Y-axis) are depicted with arbitrary unit (a. u.), in which FIG. 5A shows the lower left contact and FIG. 5B shows the upper right contact (referring to FIG. 3). When calculating the correlation, various IQC parameters can be used, such as bit line overlay, word line overlay, node contact and word line overlay, word line trench, bit line width, etc., which are not limited in the embodiment of the invention. From FIGS. 5A and 5B, the correlation between the actual measurement and the virtual metrology are about 50%. The result is the same as the prediction result shown in FIG. 4A and FIG. 4B.

Therefore, the measurement contour map by using the virtual metrology can almost represent the measurement contour maps of the actual measurement. As a result, the method of the embodiment can significantly reduce the measurement time.

Returning to FIG. 2, after the virtual measurements performed on the N-dimensional virtual image, the step S110 is performed. In step S110, the processor (CPU) 202 of the dynamic sampling device 102 determines whether the virtual metrology result is larger than a threshold. The threshold may use basic statistic values, such as mean, sigma, etc., which is not particularly limited by the invention.

The virtual metrology result may be the area of the contacts (measurement target) in the above example. Then, if the virtual metrology result is larger than a threshold, the process proceeds to step S112. Namely, the measurement is not performed on the wafer. In this case, based on the prediction by using the virtual metrology of the embodiment, the result can meet the history measurement result and thus performing the actual measurement is not required. The history measurement may be a value set by the user or operator based on the experience value or the historic data provided from the semiconductor device 104 in the past operation.

In contrast, if the virtual metrology result is not larger than the threshold, the process proceeds to step S114 to determine on the wafer. In step S114, the sampling positions (scan sites or (measurement points) to which the measurement has to be performed are calculated based on the virtual metrology result obtained in step S108. Then, in step S116, the measurement is performed on the calculated scan sites (measurement points). In this manner, the dynamic sampling device 102 sends a control signal to instruct the measurement device 106 to carry out the measurement on the wafer in the semiconductor device 104. In addition, the dynamic sampling process may perform for lot, wafer, shot, chip and wafer location, which is not particularly limited by the invention.

Figure 6A:
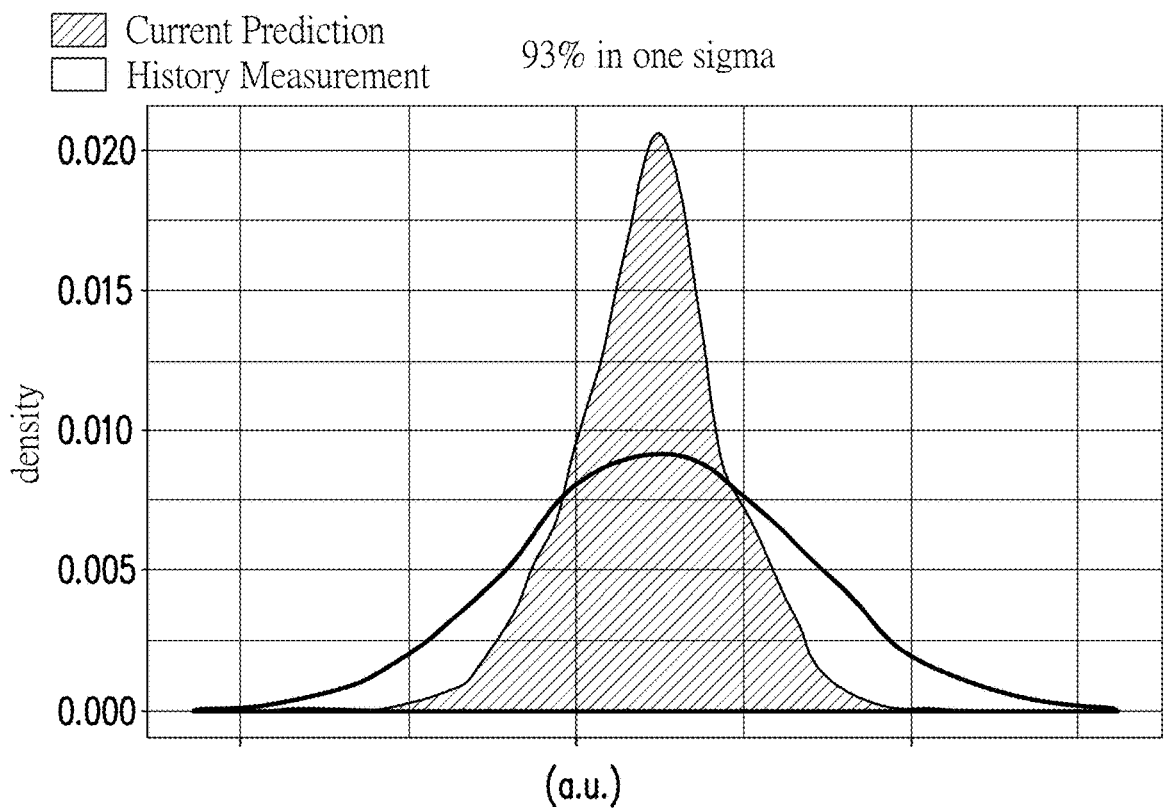
FIGS. 6A-6C illustrate examples for the concept of the threshold.
Figure 6B:
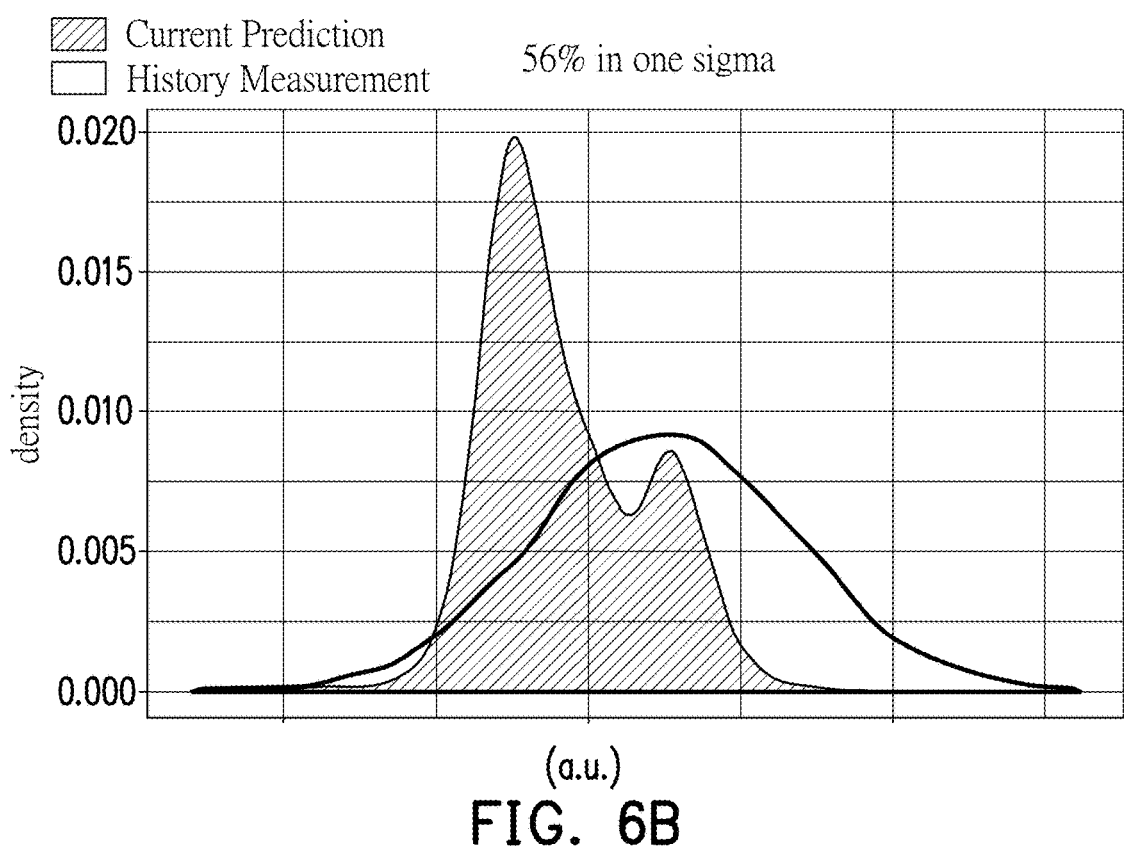
Figure 6C:
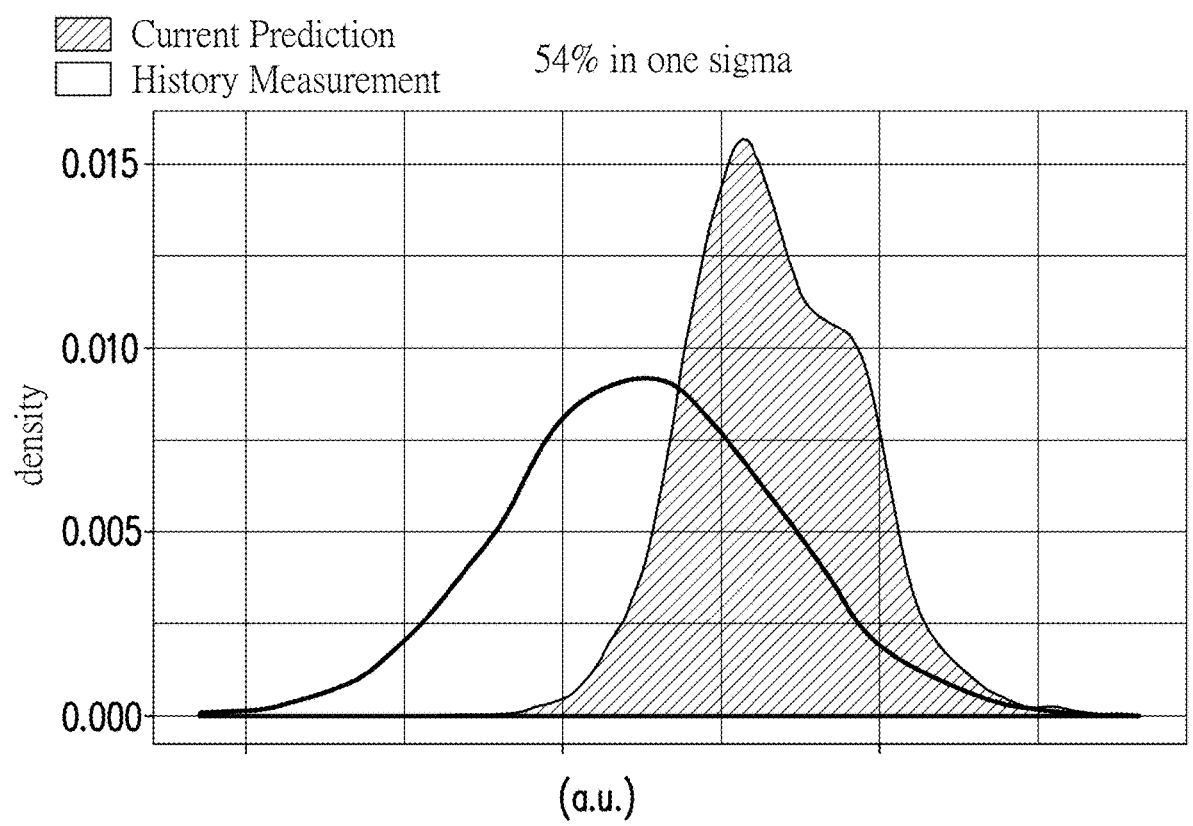

FIGS. 6A-6C illustrate examples for the concept of the threshold. In FIG. 6A, one distribution with dashed line is the prediction distribution obtained from the virtual metrology result and the other distribution is obtained from the history measurement that can be set by the user. Furthermore, the user can set the threshold to a value of 70% as an example. In FIG. 6A, the prediction distribution obtained from the virtual metrology result shows a result of 93% in one sigma (standard deviation) and it means that the virtual metrology result is larger than the threshold of 70%. Therefore, based on the virtual metrology result, one can determine that the produced wafer should meet the history measurement and thus no further measurement is required to perform on the wafer.

Additionally, in FIGS. 6B-6C, the prediction distribution obtained from the virtual metrology result shows a result of 56% or 54% in one sigma (standard deviation) and it means that the virtual metrology result is not larger than the threshold of 70%. Therefore, based on the virtual metrology result, one can determine that the produced wafer fails to meet the history measurement and thus further measurement is required to perform on the wafer. Once further measurement is required, the dynamic sampling device 102 is further configured to determine the sampling positions to which the measurement is to be performed.

Figure 7:
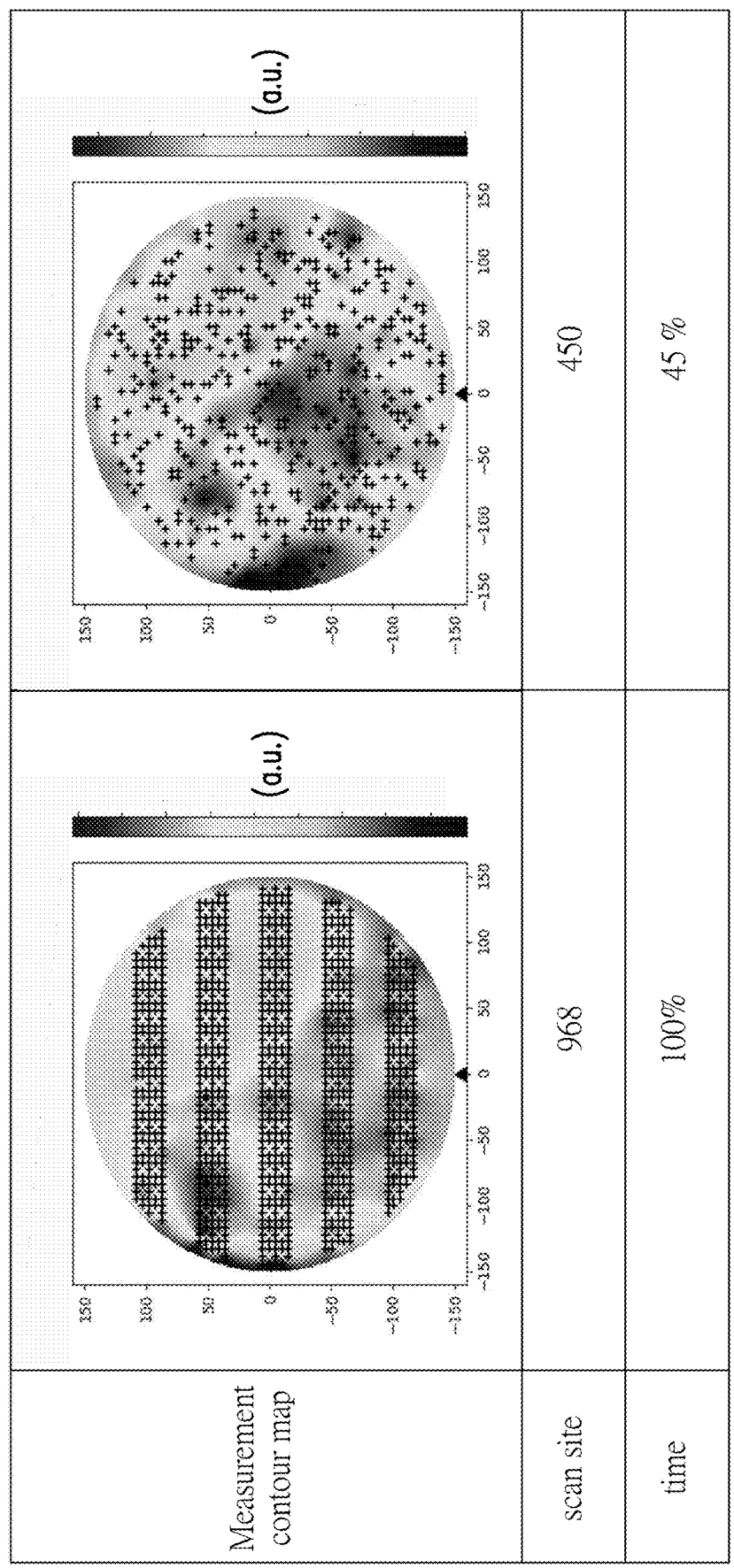
FIG. 7 illustrate measurement contour maps of the final measurement between the actual measurement and the virtual metrology.

FIG. 7 illustrate measurement contour maps of the final measurement between the actual measurement and the virtual metrology. FIG. 7 is an example after the node contact being formed. The left portion of FIG. 7 shows that after the process of forming the node contact is formed, the current method is to measure 968 scan sites (measurement positions) of the wafer.

In contrast, according to the embodiment, the N-dimensional virtual image is used to perform the virtual metrology without actual measurement. Then, the virtual metrology result is analyzed so as to determine scan sites (measurement positions) to be measured. In this manner, as shown in the right portion of FIG. 7 the scan sites (measurement positions) to be measured are reduced to 450 points, which are about half of the scan sites of the current method. As a result, the actual measurement time can be significantly reduced to 45%, which is about less than half of the measurement time of the current method.

As described, according to the embodiment of the invention, the N-dimensional virtual image is first used to perform the dynamic sampling method, and thus it is not necessary to perform all scan sites on the wafer. The scan sites and the measurement time can be thus effectively reduced. In addition, since a critical pattern distribution in wafer could be known one day before, the virtual N-dimensional image measurement data can be used for process feedback and process feedforward.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A dynamic sampling method for semiconductor manufacture performed by a processor, comprising:
    generating an N-dimensional virtual image of a wafer based on a design rule and at least one of a quality control data and context data, wherein the quality control data comprises at least one of in line quality control (IQC) data and machine quality control (MQC) data;
    measuring a critical pattern in the N-dimensional virtual image to generate a virtual metrology result by using a virtual metrology;
    determining whether to perform a measurement on the wafer by determining whether the virtual metrology result is larger than a threshold;
    not performing the measurement on the wafer in a case that the virtual metrology result is larger than the threshold; and
    performing the measurement on the wafer in a case that the virtual metrology result is not larger than the threshold.

2. The dynamic sampling method of claim 1, further comprising:
    collecting the design rule and at least one of the quality control data and the context data from a semiconductor device.

3. The dynamic sampling method of claim 1, further comprising:
    setting a model for generating the N-dimensional virtual image based on the design rule and at least one of the quality control data and the context data.

4. The dynamic sampling method of claim 3, wherein the model is set using a machine learning or a deep learning.

5. The dynamic sampling method of claim 1, wherein in the case that the virtual metrology result is not larger than the threshold, determining sampling positions based on the virtual metrology result, and
    performing the measurement to the sampling positions of the wafer.

6. The dynamic sampling method of claim 1, wherein the IQC data includes items of critical dimension data and overlay data.

7. The dynamic sampling method of claim 1, wherein the design rule comprises at least an alignment tree.

8. The dynamic sampling method of claim 1, wherein the threshold is a statistic value including at least one of a mean value or a standard deviation.

9. The dynamic sampling method of claim 1, wherein the critical pattern comprises at least one of a shape, a critical dimension, an area and a distance among patterns for a measurement target by using a virtual metrology.

10. A dynamic sampling device for semiconductor manufacture, comprising:
    a processor; and
    a storage unit,
    wherein the processor is configured to:
    generate an N-dimensional virtual image of a wafer based on a design rule and at least one of a quality control data and context data, wherein the quality control data comprises at least one of in line quality control (IQC) data and machine quality control (MQC) data;
    measure a critical pattern in the N-dimensional virtual image to generate a virtual metrology result by using a virtual metrology;
    determine whether to perform a measurement on the wafer by determining whether the virtual metrology result is larger than a threshold;
    not perform the measurement on the wafer in a case that the virtual metrology result is larger than the threshold; and
    perform the measurement on the wafer in a case that the virtual metrology result is not larger than the threshold.

11. The dynamic sampling device of claim 10, wherein the processor is further configured to collect the design rule and at least one of the quality control data and the context data from a semiconductor device that performs a manufacturing process on the wafer, and store the design rule and at least one of the quality control data and the context data in the storage unit.

12. The dynamic sampling device of claim 10, wherein the processor is further configured to set a model for generating the N-dimensional virtual image based on the design rule and at least one of the quality control data and the context data.

13. The dynamic sampling device of claim 12, wherein the model is set using a machine learning or a deep learning.

14. The dynamic sampling method of claim 10, wherein in the case that the virtual metrology result is not larger than the threshold, the processor is configured to;
  determine sampling positions based on the virtual metrology result, and
  perform the measurement to the sampling positions of the wafer.

15. The dynamic sampling device of claim 10, wherein the IQC data includes items of critical dimension data and overlay data.

16. The dynamic sampling device of claim 10, wherein the design rule comprises at least an alignment tree.

17. The dynamic sampling device of claim 10, wherein the threshold is a statistic value including at least one of a mean value or a standard deviation.

18. The dynamic sampling device of claim 10, wherein the virtual metrology result is a result of at least one of a shape, a critical dimension, an area and a distance among patterns for a measurement target by using a virtual metrology.

\* \* \* \* \*